United States Patent
Ozawa et al.

(10) Patent No.: US 6,483,772 B2
(45) Date of Patent: Nov. 19, 2002

(54) SEMICONDUCTOR MEMORY DEVICE CAPABLE OF MASKING DATA TO BE WRITTEN

(75) Inventors: Susumu Ozawa, Yokohama (JP); Shigeo Ohshima, Yokohama (JP); Katsumi Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/951,230

(22) Filed: Sep. 12, 2001

(65) Prior Publication Data

US 2002/0031020 A1 Mar. 14, 2002

(30) Foreign Application Priority Data

Sep. 12, 2000 (JP) ........................................ 2000-277108

(51) Int. Cl.⁷ .............................. G11C 8/00; G11C 7/00
(52) U.S. Cl. ................ 365/233; 365/189.05; 365/238.5
(58) Field of Search ............................ 365/189.05, 233, 365/238.5

(56) References Cited

U.S. PATENT DOCUMENTS 6,219,747 B1 * 4/2001 Banks et al. ................ 711/105
6,286,077 B1 * 9/2001 Choi et al. .................. 711/105

FOREIGN PATENT DOCUMENTS

JP 09-167485 6/1997

OTHER PUBLICATIONS

Paul Coteus, "Future DRAM Task Force Status Report", Oct. 18, 1998.

* cited by examiner

Primary Examiner—Son Mai
(74) Attorney, Agent, or Firm—Hogan & Hartson, LLP (57) ABSTRACT

A specifying circuit specifies either the first masking method or the second masking method. A first generation circuit generates a signal corresponding to the first method. A second generation circuit generates a signal corresponding to the second method. A third generation circuit generates a write pulse signal on the basis of the output signal of the first generation circuit in response to the specification of the first masking method made by the specifying circuit and on the basis of the output signal of the second generation circuit in response to the specification of the second masking method made by the specifying circuit.

20 Claims, 10 Drawing Sheets

| BL(MRS) | AILTC1t | AILTC0t | VWBL4 | VWBL2 | VWBL1 | WBL |
|---|---|---|---|---|---|---|
| 8 | 0<br>1<br>0<br>1 | 0<br>0<br>1<br>1 | L<br>(H)<br>L<br>L | L<br>L<br>(H)<br>H | L<br>L<br>L<br>(H) | 8<br>4<br>2<br>1 |
| 4 | 0<br>1<br>0<br>1 | 0<br>0<br>1<br>1 | (H)<br>(H)<br>L<br>L | L<br>L<br>(H)<br>H | L<br>L<br>L<br>(H) | 4<br>4<br>2<br>1 |
| 2 | 0<br>1<br>0<br>1 | 0<br>0<br>1<br>1 | L<br>L<br>L<br>L | (H)<br>H<br>(H)<br>H | L<br>(H)<br>L<br>(H) | 2<br>1<br>2<br>1 |

SEMICONDUCTOR MEMORY DEVICE CAPABLE OF MASKING DATA TO BE WRITTEN

CROSS-REFERENCE TO RELATED APPLICATIONS

This application is based upon and claims the benefit of priority from the prior Japanese Patent Application No. 2000-277108, filed Sep. 12, 2000, the entire contents of which are incorporated herein by reference.

BACKGROUND OF THE INVENTION

1. Field of the Invention

This invention generally relates to a peripheral circuit of a DRAM. More particularly, it relates to a semiconductor memory device adapted to use a masking method that makes it capable of masking data to be written.

2. Description of the Related Art

Single data rate (SDR)-synchronous DRAMs (SDRAMs) are being popularly used at present. SDR-SDRAMs are capable of specifying various functional features for itself according to the objective of the user of using the device. For example, it is possible to mask a part of the data to be written so that the part may not be actually written. For that purpose, SDR-SDRAMs are provided with a pin for supplying mask data that is referred to as DM pin.

While the user may use the data mask in various different ways, it is often and primarily used to mask the last data to be written in order to avoid collisions of data on the internal data path at the time of an interrupt.

The data mask method (DM) and the variable write burst length (VW) method are two popular methods for masking data.

Figure 13:
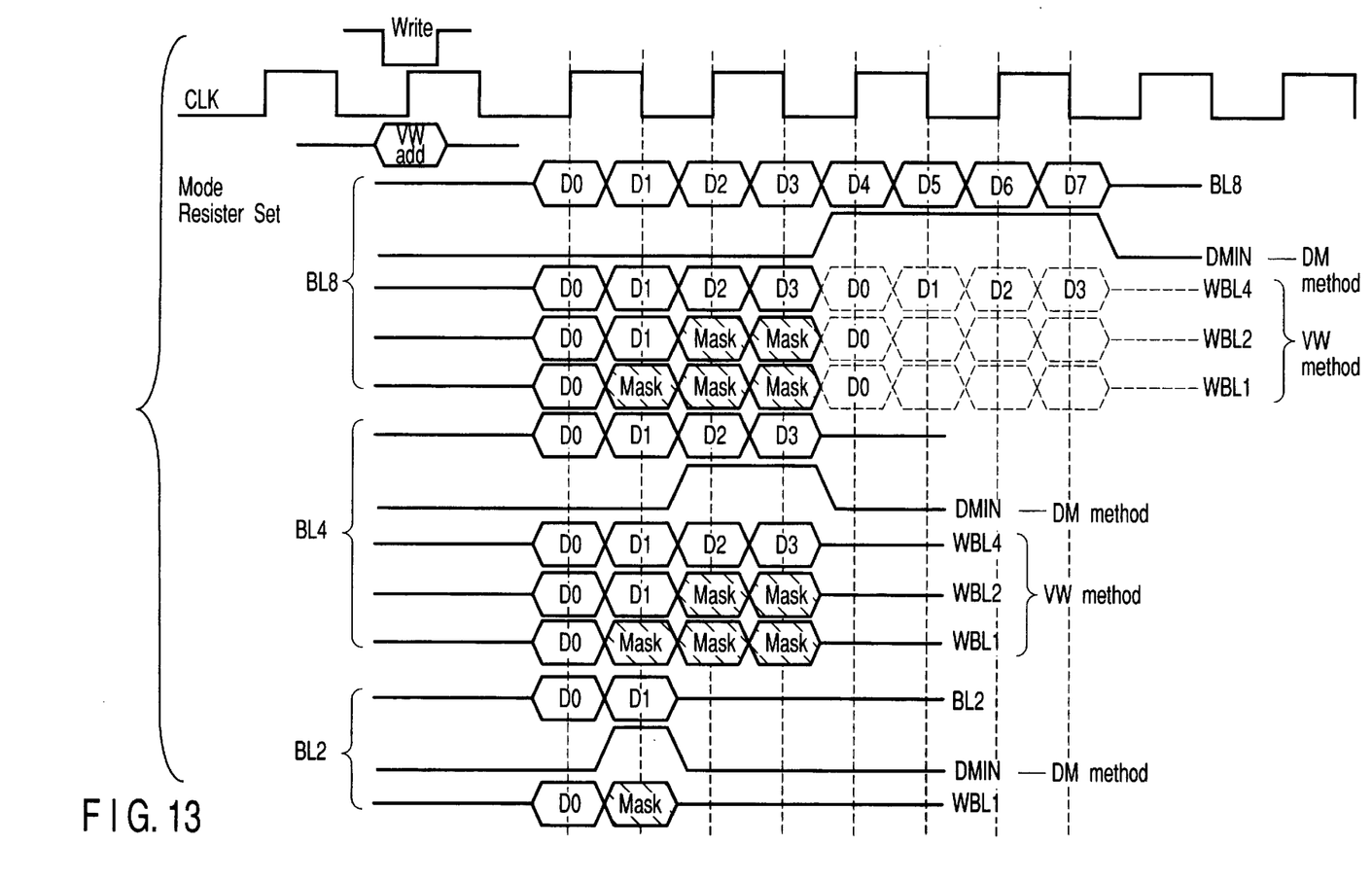
FIG. 13 is a timing chart for the operation of the DM method and also that of the VW method.

FIG. 13 is a timing chart for both the DM method and the VW method illustrated in terms of burst length.

For example, referring to FIG. 13, if control signal DMIN fed to the DM pin is set to level HIGH for the purpose of writing data D0 through D7 with a burst length of BL=8 in synchronism with clock signal CLK, data D4, D5, D6 and D7 that correspond to the level HIGH period are masked.

With the DM method, once a write operation is started, the next command cannot be input until the time period necessary for processing all the data for the selected burst length is over. Referring again to FIG. 13, if the last four data do no need to be written at BL=8, it is not possible with the DM method to enter the next command until a clock cycle for eight data is over. This means that clock cycles are wasted for nothing.

On the other hand, with the VW method, data are masked by selecting a burst length that is different from that of the mode register when entering a write command. More specifically, a higher order address VWadd showing the burst length is input by using an unused pin simultaneously at the time of inputting a write command. Then, a burst length WBLn is defined for writing data as a function of the higher order address VWadd. Only data for the defined burst length WBLn are written in the memory cell array, while all the other data are masked.

With the VW method, the write operation is terminated immediately before the masked data and then data are no longer supplied to the data path. Thus, no collisions of data occur on the data path and hence the next write command can be input without problem. Then, the path occupancy ratio can be improved. Additionally, unlike the DM method, it is not necessary to provide a dedicated DM pin and hence the VW method can do with a reduced number of pins.

Meanwhile, various fast cycle RAMs (FCRAMs) and double data rate-SDRAMs (DDRIIs) have been proposed recently. The next generation high speed DRAMs including FCRAMs and DDRIIs use chip scale packages (CSPs). One of the significant problems of CSPs in terms of assembling is to provide an enough space for arranging solder balls and also for internal wiring. The VW method can operate with a reduced number of pins if compared with the DM method. In other words, the VW method is advantageous to the DM method in terms of assembling. Therefore, the VW method is expected to be applied to FCRAMs and DDRIIs.

However, this kind of memory devices are now in the transitional period of moving from the DM method to the VW method. In other words, at present there are users who are using the DM method and those who are using the VW method. Therefore, there is a demand for semiconductor memory devices that can adapt themselves to both the DM method and the VW method by means of a single chip.

BRIEF SUMMARY OF THE INVENTION

In an aspect of the invention, there is provided a semiconductor memory device comprising: a specifying circuit for specifying one of the first masking method and the second masking method; a first generation circuit for generating a signal corresponding to the first masking method; a second generation circuit for generating a signal corresponding to the second masking method; and a third generation circuit connected to the output terminal of the second generation circuit; wherein the third generation circuit configured to generate a write pulse signal on the basis of the output signal of the first generation circuit in response to the specification made by the specifying circuit of the first masking method and on the basis of the output signal of the second generation circuit in response to the specification made by the specifying circuit of the second masking method.

DETAILED DESCRIPTION OF THE INVENTION

Now, the present invention will be described by referring to the accompanying drawing that illustrates preferred embodiments of the invention.

(1st Embodiment)

Figure 1:
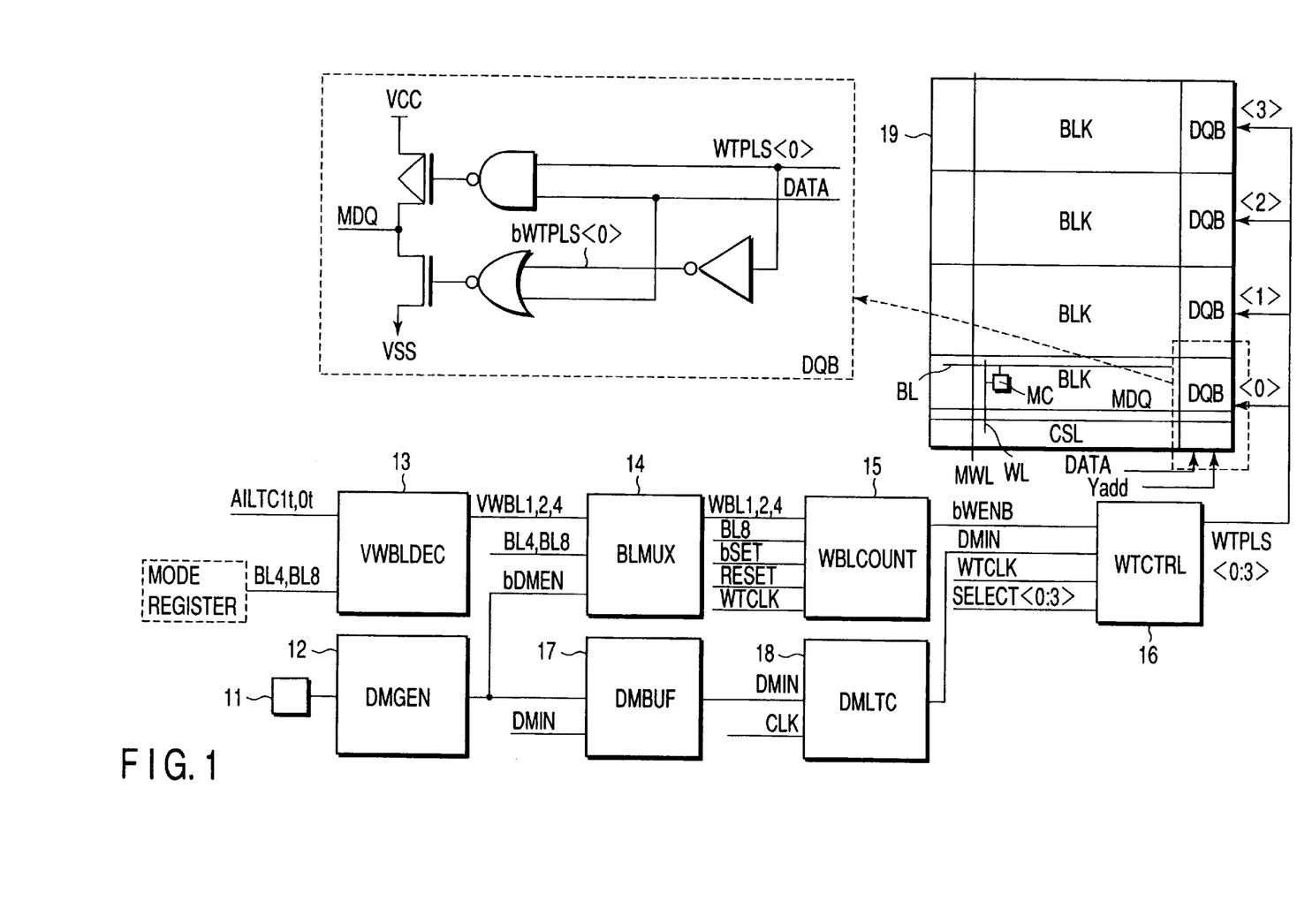
FIG. 1 is a schematic block diagram of the first embodiment of the present invention.

FIG. 1 is a schematic block diagram of the first embodiment of semiconductor memory device according to the invention. The semiconductor memory device is adapted to use both the DM method and the VW method. Either the DM method or the VW method is selected depending on if a wire is bonded to the optional bonding pad or not.

Firstly, the configuration of this embodiment of semiconductor memory device according to the invention will be described summarily. Referring to FIG. 1, option pad 11 is provided to select either the DM method or the VW method. The option pad 11 is connected to DM signal generation circuit (DMGEN) 12. The DM signal generation circuit 12 generates a low level signal bDMEN (b denoting a low active signal) when the option pad 11 is open and not grounded.

For a write operation, higher order addresses AILTC1t, AILTC0t are supplied to decoder (VWBLDEC) 13 adapted to generate burst lengths for the VW method. The decoder 13 is also adapted to be fed with burst lengths BL4, BL8 supplying from a mode register (not shown). The decoder 13 decodes the higher order addresses AILTC1t, AILTC0t according to a decoding table, which will be described hereinafter, and generates decode/output signals VWBL1, VWBL2, VWBL4.

The decode/output signals VWBL1, VWBL2, VWBL4 and the signal bDMEN output from the DM signal generation circuit 12 are then supplied to the input terminal of multiplexer (BLMUX) 14 adapted to multiplex burst lengths. Additionally, burst lengths BL4, BL8 that are fed from a mode register (not shown) are supplied to the input terminal of the multiplexer 14. The multiplexer 14 selects the burst lengths BL4, BL8 for the DM method when signal bDMEN is active, whereas it selects the burst lengths for the VW method, which are the decode/output signals VWBL1, 2, 4 fed from the decoder 13, when signal bDMEN is non-active. The output signals WBL1, 2, 4 of the multiplexer 14 are supplied to counter (WBLCOUT) 15, which counter 15 counts the write burst length.

The input terminal of the counter 15 is fed with burst length BL8 that is supplied from the mode register, set signal bSET for activating the counter according to the write command, reset signal RESET for resetting the counter for an operation other than a write operation and basic internal clock signal WTCLK to be used for a write operation.

The counter 15 starts counting when the set signal bSET is brought to level LOW according to the write command and stops counting when the count gets to the value of the write burst length supplied from the multiplexer 14. The write enable signal bWENB output from the counter 15 is made active (level LOW) when the counter 15 starts counting and made non-active (level HIGH) when the counter 15 stops counting. The write enable signal bWENB is supplied to write control circuit (WTCTRL) 16.

On the other hand, the output signal bDMEN of the DM signal generation circuit 12 is supplied to buffer circuit (DMBUF) 17 adapted to receive the control signal for the DM method. The buffer circuit 17 typically is composed of a current mirror type buffer circuit. When the DM method is selected and hence the signal bDMEN is at level LOW, the buffer circuit 17 receives control signal DMIN for the DM method fed from an external connection pin (not shown) and outputs the control signal DMIN. When, on the other hand, the DM method is not selected and hence the signal bDMEN is at level HIGH, the output signal of the buffer circuit 17 is at level LOW. The buffer circuit 17 is connected to latch circuit (DMLTC) 18 adapted to latch the control signal DMIN.

The latch circuit 18 latches the control signal DMIN in synchronism with external clock signal CLK, which is used to take in data in a manner as will be described hereinafter. In other words, the latch circuit 18 latches the control signal DMIN at the timing of taking in data. The control signal output from the latch circuit 18 is then supplied to the write control circuit 16.

The write control circuit 16 is also supplied with basic internal clock signal WTCLK and one of selection signals SELECT0 through SELECT3 for selecting the corresponding one of the blocks of memory cell array 19. Then, the write control circuit 16 generates the corresponding one of write pulse signals WTPLS0 through WPTLS3 for writing data in the memory cell array 19.

If the DM method is selected, the write control circuit 16 makes any of the write pulse signals WTPLS0 through WTPLS3 active according to the time period of the level LOW of the control signal DMIN supplied from the latch circuit 18 and writes data in the memory cell array 19. Additionally, the write control circuit 16 makes the write pulse signals WTPLS0 through WTPLS3 non-active according to the time period of the level HIGH and masks some of the data to be written.

If, on the other hand, the VW method is selected, the control signal DMIN is always held to level LOW. Therefore, the write control circuit 16 activates any of the write pulse signals WTPLS0 through WTPLS3 according to the write enable signal bWENB fed from the counter 15.

The write pulse signals WTPLS0 through WTPLS3 output from the write control circuit 16 are fed to the data buffer circuit DQB of the block BLK selected by one of the selection signals SELECT0 through SELECT3. Each of the data buffer circuits DQB is adapted to activate main data line MDQ according to the selected one of the write pulse signals WTPLS0 through WTPLS3 and the data DATA. The memory cell array 19 is typically provided with data lines DQ (not shown) connected to the main data line MDQ, bit lines BL selectively connected to the data lines DQ, word lines WL arranged to cross the bit lines BL and main word line MWL selectively connected to the word lines WL. The memory cells MC are arranged at the respective crossings of the bit lines BL and the word lines WL.

Figure 2:
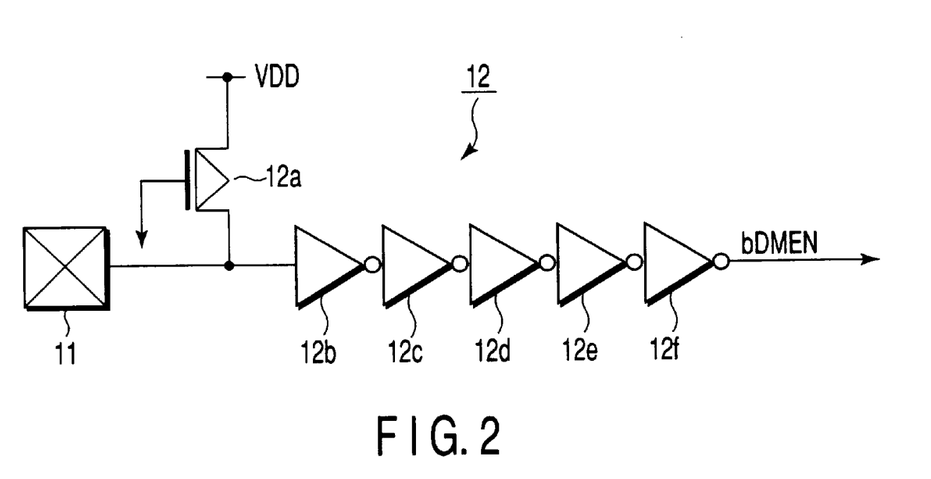
FIG. 2 is a schematic circuit diagram illustrating the relationship between the option pad and the DM signal generation circuit in FIG. 1.

FIG. 2 is a schematic circuit diagram illustrating the relationship between the option pad 11 and the DM signal generation circuit 12 in FIG. 1. Referring to FIG. 2, the DM signal generation circuit 12 comprises a P-channel MOS transistor 12a and a plurality of inverter circuits 12b through 12f connected in series to the MOS transistor 12a. Supply voltage VDD is applied to one end of the current path of the P-channel MOS transistor 12a and the other end of the current path is connected to the option pad 11. The gate of the MOS transistor 12a is grounded. The input terminals of said inverter circuits 12b are connected to the option pad 11.

Figure 3:
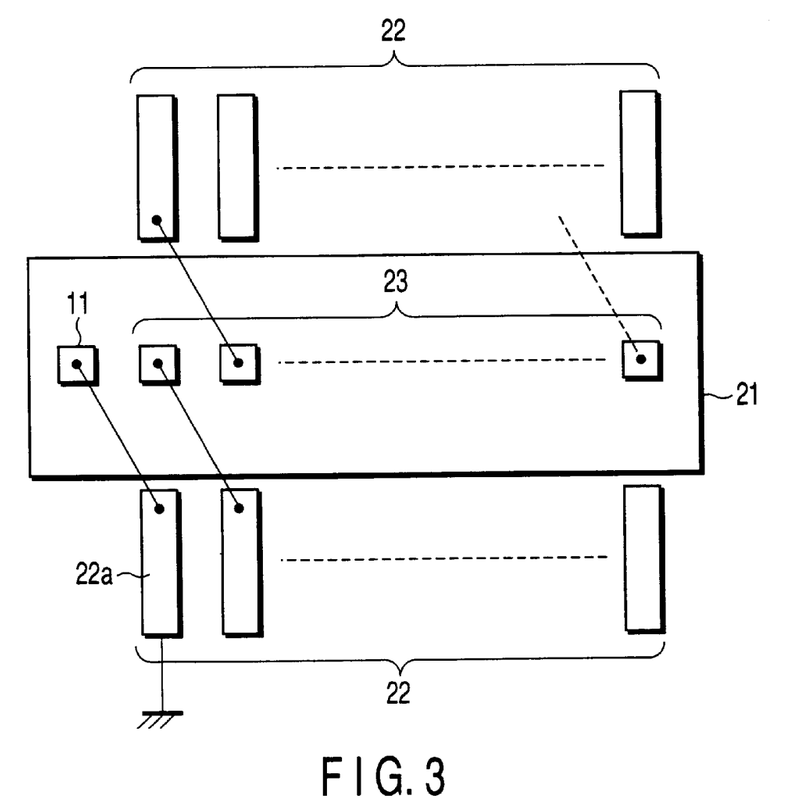
FIG. 3 is a schematic illustration of an example of connection of the option pad.

FIG. 3 shows the semiconductor chip 21 where the embodiment of semiconductor memory device according to the invention is arranged and a plurality of inner leads 22.

The semiconductor chip 21 is provided with a plurality of pads and said option pad 11.

The transistor 12a has a poor power supply potential and is always held to the ON state. Therefore, when the option pad 11 is not connected to any element, low level signal bDMEN for selecting the DM method is output from the output terminal of the inverter circuit 12f.

When, on the other hand, as shown in FIG. 3, the option pad 11 is connected to the inner lead 22a that is grounded, the signal bDMEN of the inverter circuit 12f is held to level HIGH to select the VW method.

Figure 4:
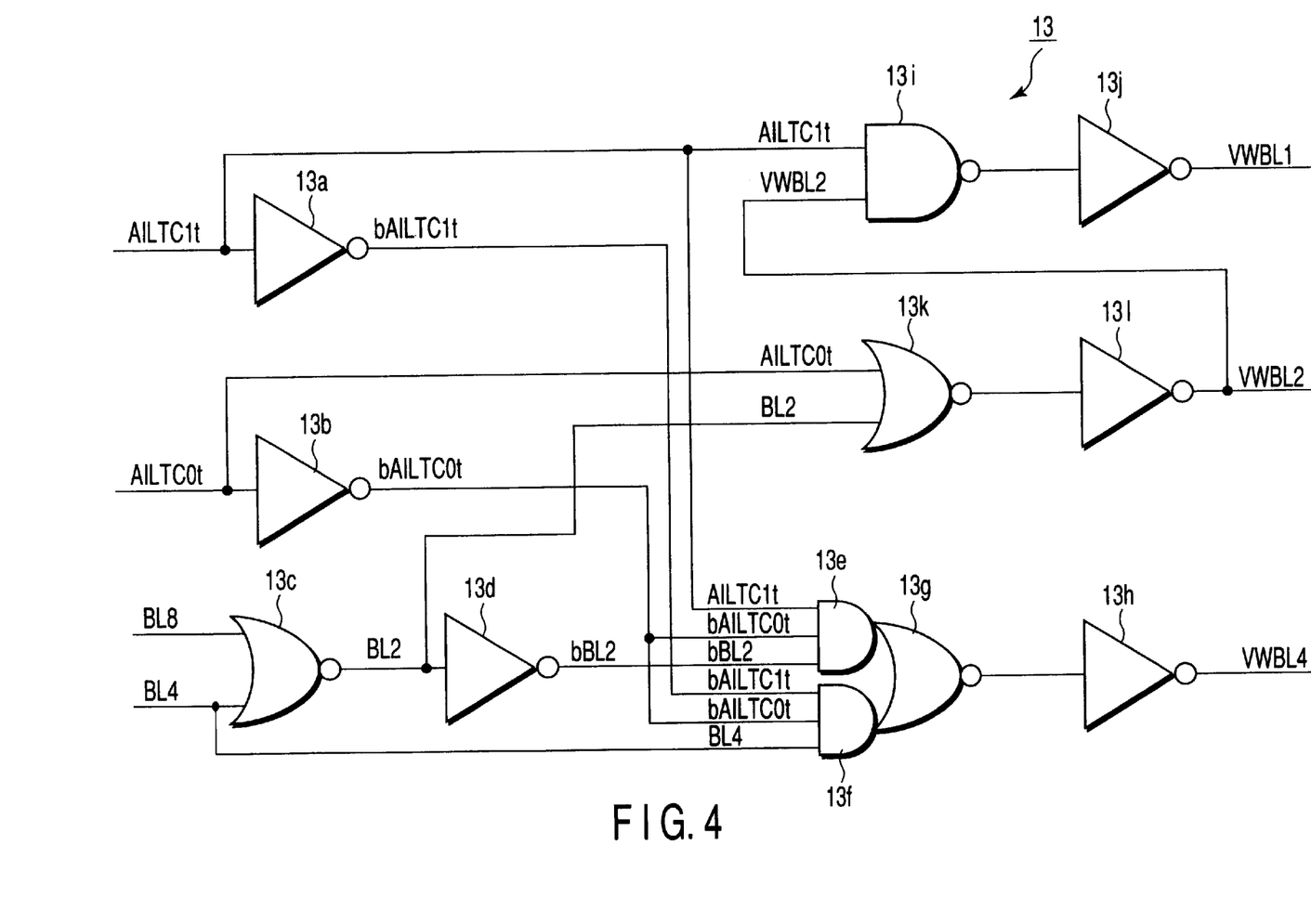
FIG. 4 is a schematic circuit diagram of a decoder that can be used for the embodiment of FIG. 1.

FIG. 4 is a schematic circuit diagram of a decoder that can be used as the decoder 13 of the embodiment of FIG. 1. The higher order address signals AILTC1t, AILTC0t taken in simultaneously with a write command are supplied to the respective input terminals of inverter circuits 13a, 13b. The output signal bAILTC1t of the inverter circuit 13a is supplied to AND circuit 13f. The output signal bAILTC0t of the inverter circuit 13b is supplied to AND circuits 13e and 13f.

The signals indicating the burst lengths BL8, BL4 and fed from the mode register are supplied to the input terminal of NOR circuit 13c. The signal indicating the burst length BL2 output from the NOR circuit 13c is supplied to said AND circuit 13e through the inverter circuit 13d and also to NOR circuit 13k along with said higher order signal AILTC0t. The output signal of the NOR circuit 13k is supplied to inverter circuit 13l and signal VWBL2 is output from the output terminal of the inverter circuit 13l. The signal VWBL2 is supplied to NAND circuit 13i along with said higher order address AILTC1t. The output signal of the NAND circuit 13i is supplied to inverter circuit 13j. Signal VWBL1 is output from the output terminal of the inverter circuit 13j.

The output signal bBL2 of the inverter circuit 13d and said higher order address signal AILTC1t are supplied to said AND circuit 13e. The signal indicating the burst length BL4 is supplied to said AND circuit 13f. The output signals of the AND circuit 13e, 13f are supplied to the inverter circuit 13h by way of the NOR circuit 13g. Signal VWBL4 is output from the output terminal of the inverter circuit 13h.

Figure 5:
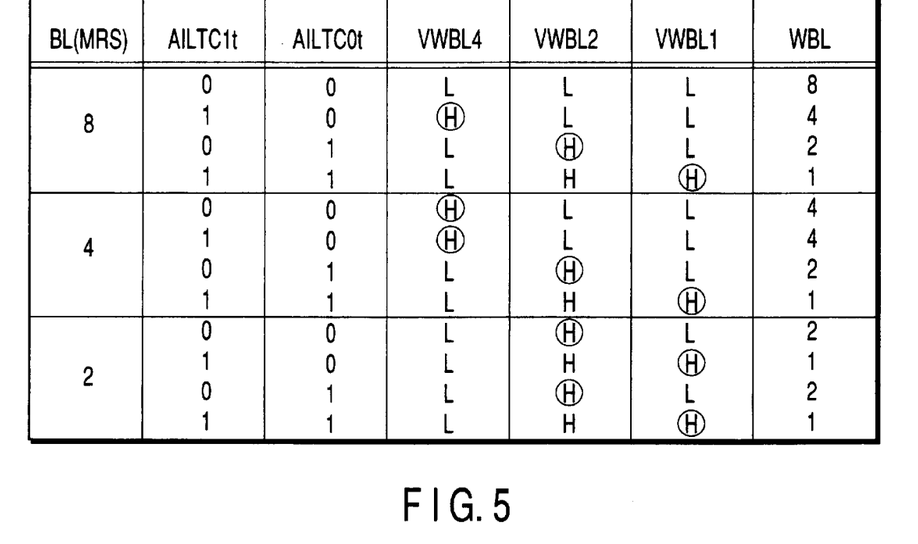
FIG. 5 is a schematic illustration of the operation of the decoder of FIG. 4.

With the above described arrangement, the decoder 13 decodes the higher order address signals AILTC0t, AILTC1t according to the burst length stored in the mode register (MRS) as shown in FIG. 5 and outputs signals VWBL4, VWBL2, VWBL1. As shown in FIG. 5, the decoder 13 is adapted to disregard any specified burst length except the one stored in the mode register (MRS).

Note that BL2 in FIG. 5 indicates that both BL4 and BL8 of the mode register are at level LOW. This applies also to the following description. Referring to FIG. 5, all the output signals VWBL1, VWBL2, VWBL4 of the inverter circuits 13i, 13l, 13h are held to level LOW when the higher order address signals AILTC0t, AILTC1t are (0, 0) for BL8, although no problem arises on the counter 15 because BL8 is supplied from the mode register. The counter 15 will be described in greater detail hereinafter.

Figure 6:
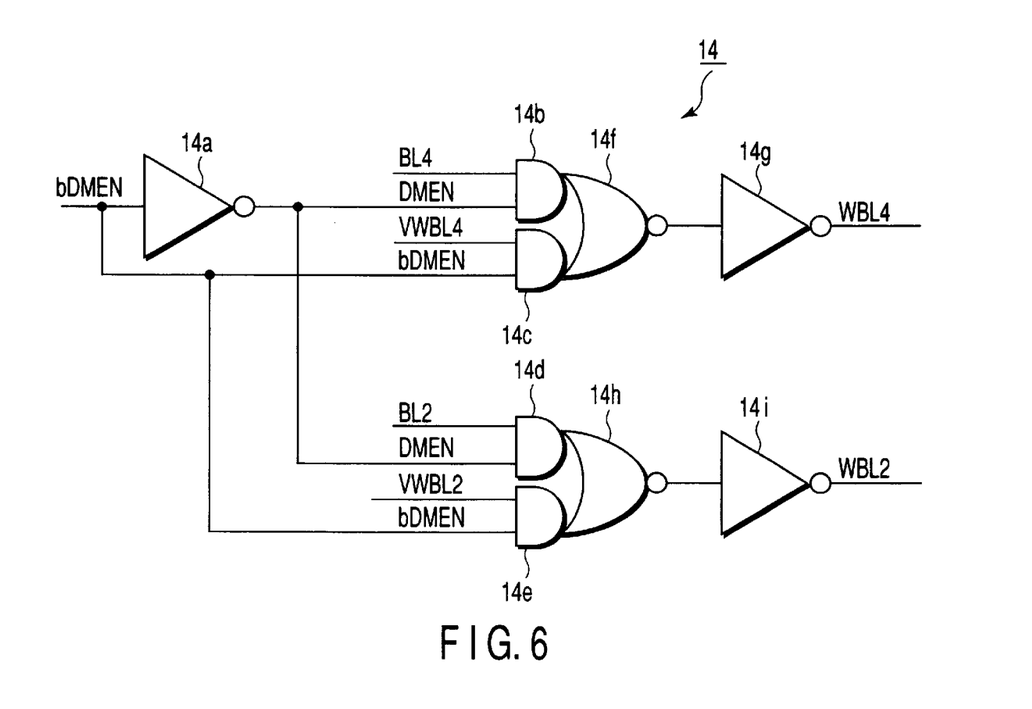
FIG. 6 is a schematic circuit diagram of a multiplexer that can be used for the embodiment of FIG. 1.

FIG. 6 is a schematic circuit diagram of a multiplexer (BLMUX) 14 that can be used for the embodiment of FIG. 1. The multiplexer 14 respond to the signal bDMEN supplied from the DM signal generation circuit 12 and selects either the burst lengths VWBL4, VWBL2 supplied from the decoder 13 for the VW method or the burst lengths BL4, BL2 supplied from the mode register and outputs the signal representing the selected burst lengths as internal burst lengths.

More specifically, referring to FIG. 6, signal bDMEN supplied from the DM signal generation circuit 12 is supplied to one of the input terminals of each of the AND circuits 14c, 14e and also to one of the input terminals of each of the AND circuits 14b, 14d by way of the inverter circuit 14a. The signal representing the burst length BL4 and output from the mode register is supplied to the other input terminal of AND circuit 14b. The signal VWBL4 output from the decoder 13 is supplied to the other input terminal of the AND circuit 14c. The signal representing the burst length BL2 and output from the mode register is supplied to the other input terminal of the AND circuit 14d. The signal VWBL2 output from the decoder 13 is supplied to the other input terminal of the AND circuit 14e. The output signals from the AND circuits 14b and 14c are supplied to the inverter circuit 14g by way of the NOR circuit 14f. The signal representing the internal burst length WBL4 is output from the output terminal of the inverter circuit 14g. The output signals of said AND circuits 14d and 14e are supplied to the inverter circuit 14i by way of the NOR circuit 14h. The signal representing the internal burst length WBL2 is output from the output terminal of the inverter circuit 14i.

In FIG. 5, WBL indicates the internal burst length that is used when the VW method is selected.

While the above described decoder 13 also outputs VWBL1, the configuration and the operation of BL1 of this embodiment are not described here for the purpose of simplicity. In other words, this embodiment is based on DDR. Therefore, the embodiment outputs two data in synchronism with the rising edge and the falling edge of a single clock signal CLK. Thus, with the VW method, basically an even number of data are controlled in synchronism with clock signals CLK. In other words, an independent control system is required for BL1. This requirement may be met by causing the write control circuit 16 to disable the operation of writing the even-numbered data.

Figure 7:
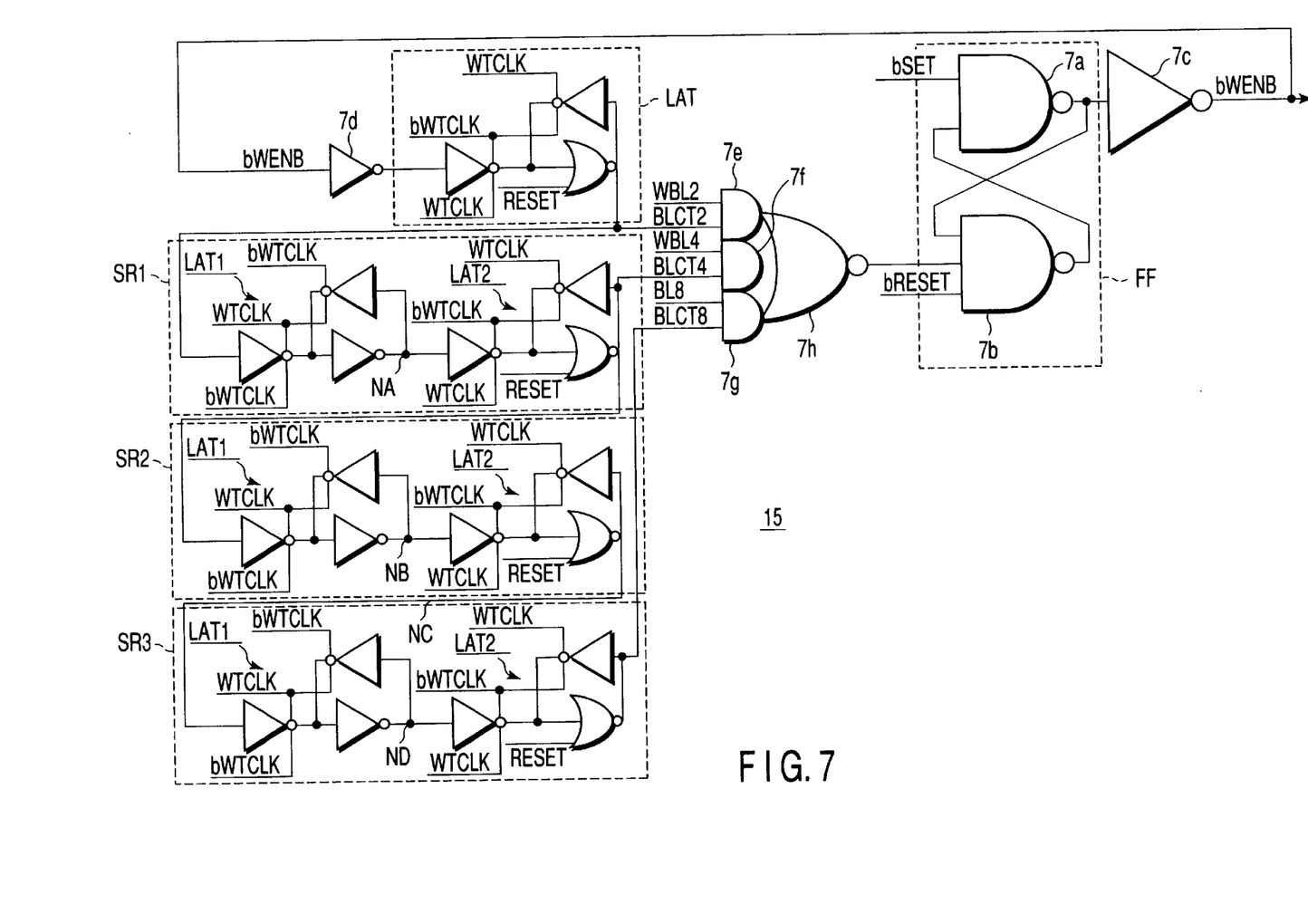
FIG. 7 is a schematic circuit diagram of a counter that can be used for the embodiment of FIG. 1.

FIG. 7 is a schematic circuit diagram of a counter that can be used for the counter (WBLCOUT) of this embodiment shown in FIG. 1. The flip-flop circuit FF comprises NAND circuits 7a, 7b. Set signal bSET is supplied to the first input terminal of the NAND circuit 7a that operates as the first input terminal of the flip-flop circuit FF. The first input terminal of the NAND circuit 7b that operates as the second input terminal of the flip-flop circuit FF is connected to the output terminal of NOR circuit 7h, which will be described hereinafter. Reset signal bRESET is supplied to the second input terminal of the NAND circuit 7b that operates as the third input terminal of the flip-flop circuit FF. The output terminal of the NAND circuit 7a that operates as the output terminal of the flip-flop circuit FF is connected to latch circuit LAT by way of inverters 7c and 7d.

The first, second and third shift registers SR1, SR2, SR3 that operate as components of the counter are connected in series to the output terminal of the latch circuit LAT. Each of the first, second and third shift registers SR1, SR2, SR3 has a pair of latch circuits LAT1, LAT2. The latch circuits LAT, LAT1, LAT2 sequentially latch the input signals according to the basic internal clock signals WTCLK, bWTCLK for write operations.

The count output signal BLCT2 indicating the burst length BL2 output from the output terminal of the latch circuit LAT is supplied to AND circuit 7e along with the internal burst length WBL2 supplied from the multiplexer 14.

The count output signal BLCT4 indicating the burst length BL4 output from the output terminal of the first shift register SR1 is supplied to AND circuit 7f along with the internal burst length WBL4 supplied from said multiplexer 14.

The count output signal BLCT8 indicating the burst length BL8 output from the output terminal of the third shift register SR3 is supplied to AND circuit 7g along with the internal burst length BL8 supplied from said mode register.

The output signals of said AND circuits 7e, 7f, 7g are supplied to said flip-flop circuit FF by way of NOR circuit 7h.

Figure 8:
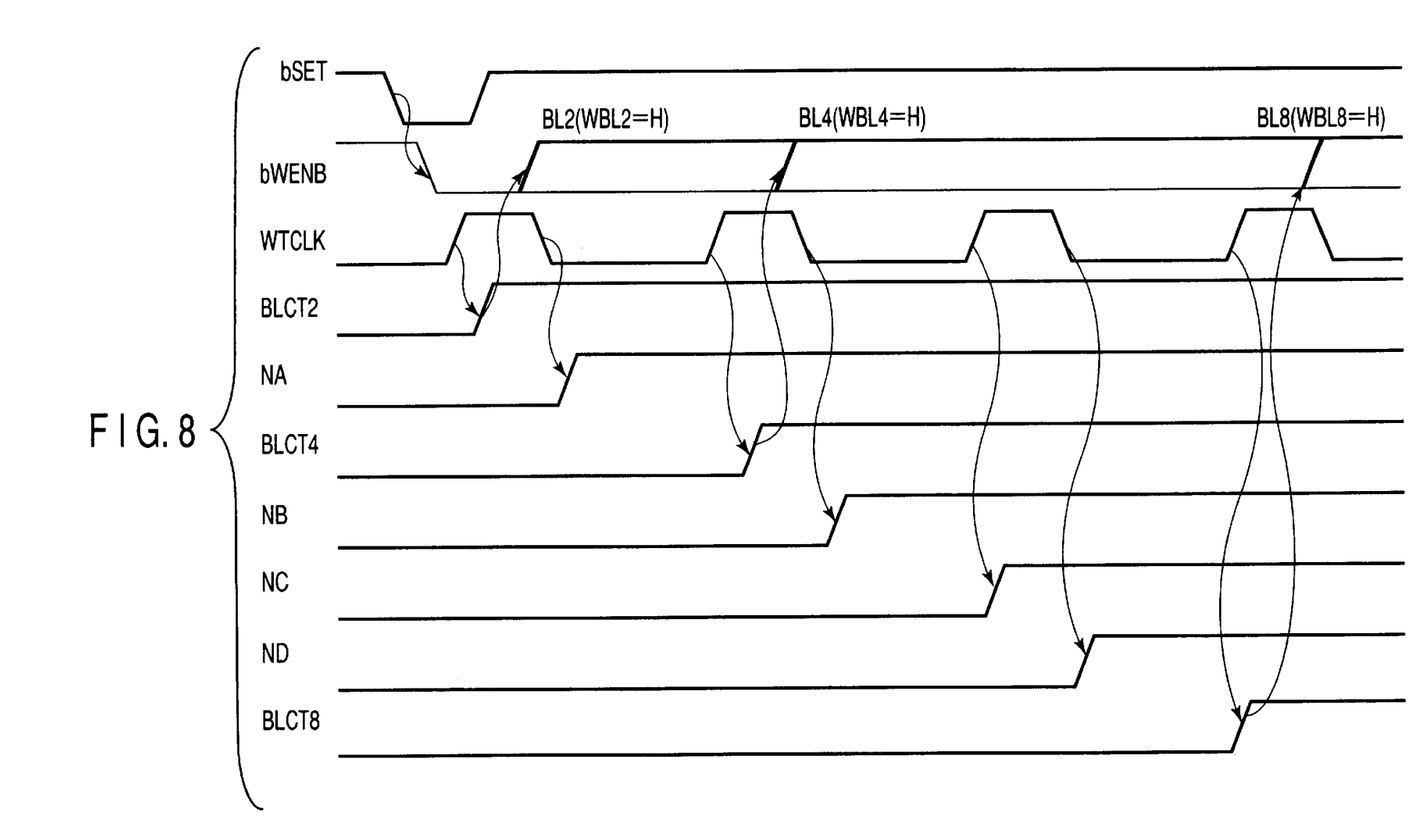
FIG. 8 is a timing chart of the operation of the counter of FIG. 7.

FIG. 8 is a timing chart for the signals of the component circuits shown in FIG. 7. It will be appreciated that same symbols are used in both FIG. 7 and FIG. 8. Now, the operation of the write burst length counter 15 shown in FIG. 7 will be described by referring to FIG. 8.

As set signal bSET is activated to activate the counter in response to the write command given to it, the output terminal of the flip-flop circuit is brought to level HIGH. Then, the write enable signal bWENB output from the output terminal of the inverter 7c is activated. The write enable signal bWENB is supplied to the latch circuit LAT by way of the inverter circuit 7d. The latch circuit LAT latches the input signals according to the basic internal clock signals WTCLK, bWTCLK. As a result, the output signal BLCT2 of the latch circuit LAT is brought to level HIGH.

The first, second and third shift registers SR1, SR2, SR3 sequentially latch the input signals so that output signals BLCT4, BLCT8 are sequentially output from the first and third shift registers SR1, SR3. The output signals BLCT2, BLCT4, BLCT8 of the latch circuit LAT, the first shift register SR1 and the third shift register SR3 are respectively supplied to the other input terminals of the AND circuits 7e, 7f, 7g. One of the internal burst length WBL2, WBL4 and the burst length BL8 is supplied to the first input terminals of the AND circuits 7e, 7f, 7g. Thus, the output signal of the NOR circuit 7h is brought to level LOW and the output signal of the flip-flop circuit FF is inverted when the input requirement of one of the AND circuits 7e, 7f, 7g is met. In other words, the timing of resetting the flip-flop circuit FF is changed by the output signals BLCT2, BLCT4, BLCT8 of the latch circuit LAT, the first shift register SR1 and the third shift register SR3, the internal burst lengths WBL2, WBL4 and the burst length BL8. Thus, the timing of turning the write enable signal bWENB non-active is changed according to the internal burst lengths WBL2, WBL4 and the burst length BL8.

Note that the counter 15 is initialized by reset signals RESET, bRESET for any operation other than the write operation.

Figure 9:
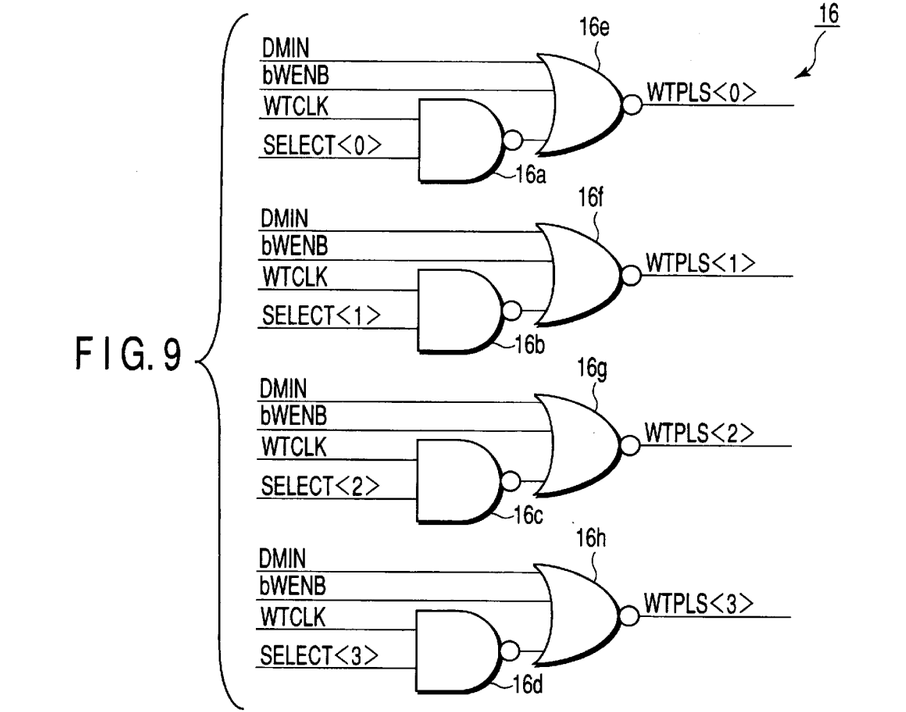
FIG. 9 is a schematic circuit diagram of the write control circuit of the embodiment of FIG. 1.

FIG. 9 is a schematic circuit diagram of the write control circuit 16 of the embodiment of FIG. 1. Referring to FIG. 9, basic internal clock signals WTCLK and selection signals SELECT0 through SELECT3 for selecting blocks of the memory cell array 19 are supplied respectively to the input terminals of the NAND circuits 16a, 16b, 16c, 16d. The output signals of the NAND circuits 16a, 16b, 16c, 16d and write enable signal bWENB from the counter 15 and control signal DMIN from the latch circuit 18 are supplied respectively to NOR circuits 16e, 16f, 16g, 16h.

When the input requirements of the NOR circuits 16e, 16f, 16g, 16h are met, they output write pulse signals WTPLS0 through WTPLS3 respectively from their output terminals. The write pulse signals WTPLS0 through WTPLS3 are then supplied to the data buffer circuit DQB of the block BLK selected by the selection signals SELECT0 through SELECT3.

If the DM method is selected and when the selection signal SELECT is at level HIGH and the basic internal clock signal WTCLK is also at level HIGH or when the control signal DMIN supplied from the latch circuit 18 is at level LOW, the basic internal clock signal WTCLKs are supplied to the selected block as write pulse signals WTPLS0 through WTPLS3. Therefore, data are written during the period. Additionally, as long as the control signal DMIN is held to level HIGH, the basic internal clock signals WTCLK are blocked and the write pulse signals WTPLS0 through WTPLS3 are held to be non-active. Thus, the data to be written are masked during this period.

If, on the other hand, the VW method is selected, the control signal DMIN is always held to level LOW. Therefore, the write pulse signals WTPLS0 through WTPLS3 are held to be active according to the write enable signal bWENB fed from the counter 15.

As described earlier, the write pulse signals WTPLS0 through WTPLS3 output from the write control circuit 16 are supplied to the data buffer circuit DQB of the block BLK selected by the selection signals SELECT0 through SELECT3. A write operation can be realized either for the DM method or for the VW method in a manner as described above.

According to the first embodiment, write pulse signals WTPLS0 through WTPLS3 are generated depending on if the DM method or the VW method is selected and the VW method is switched to the DM method or vice versa by connecting or disconnecting the option pad 11. Thus, either the DM method or the VW method is selected with a single semiconductor memory device according to the specification made by the user.

Additionally, either the DM method or the VW method is selected by connecting or disconnecting the option pad 11. In other words, a chip comprising a semiconductor memory device according to the invention can be adapted to define the function of connecting the option pad 11 and that of disconnecting the option pad 11 according to the user's request. Therefore, the time from the request of the user to the shipment can be reduced significantly.

Moreover, one option pad may increase on the surface of the semiconductor chip; therefore, a bad effect to the assembly will be prevented.

(2nd Embodiment)

Figure 10:
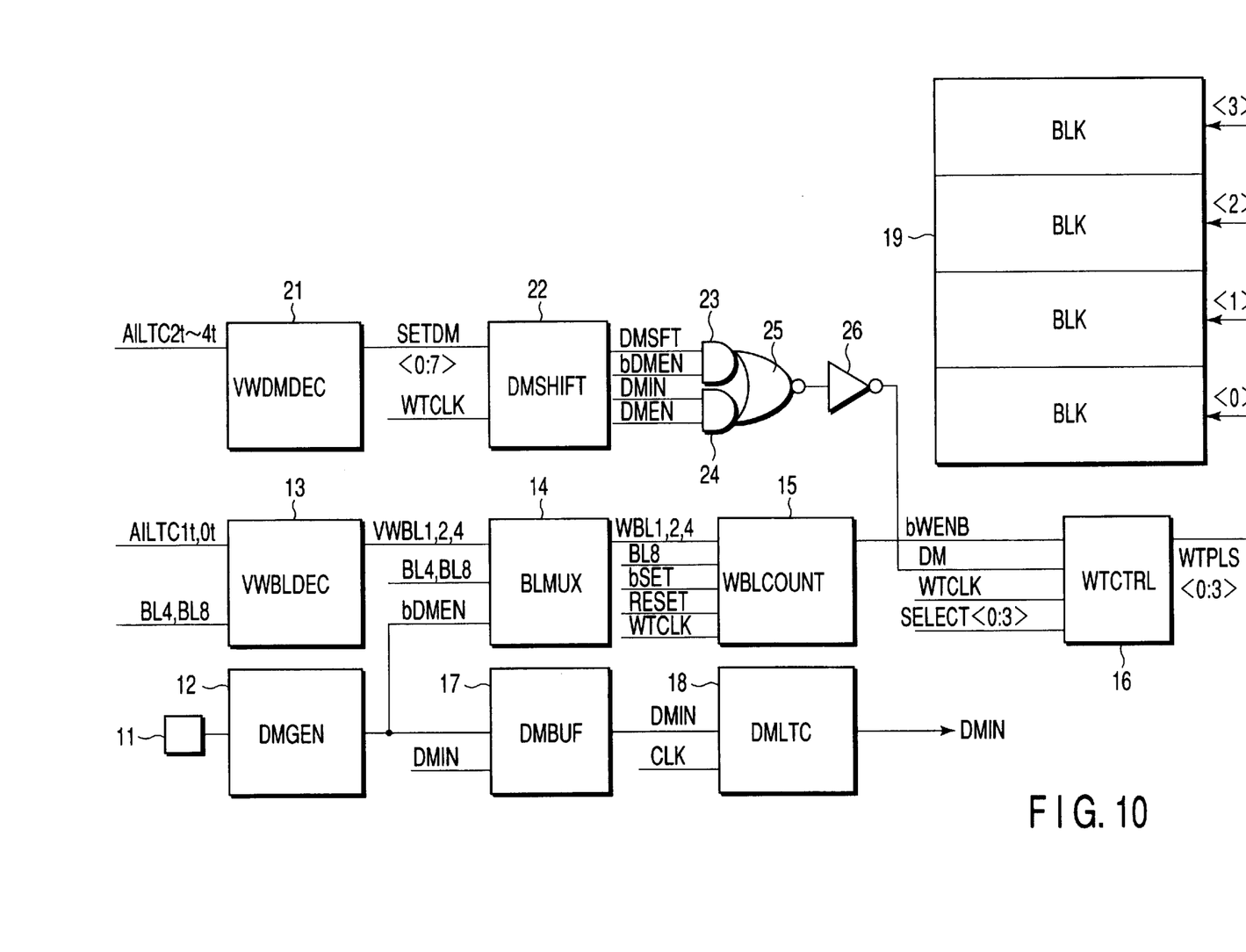
FIG. 10 is a schematic block diagram of the second embodiment of the present invention.
Figure 11:
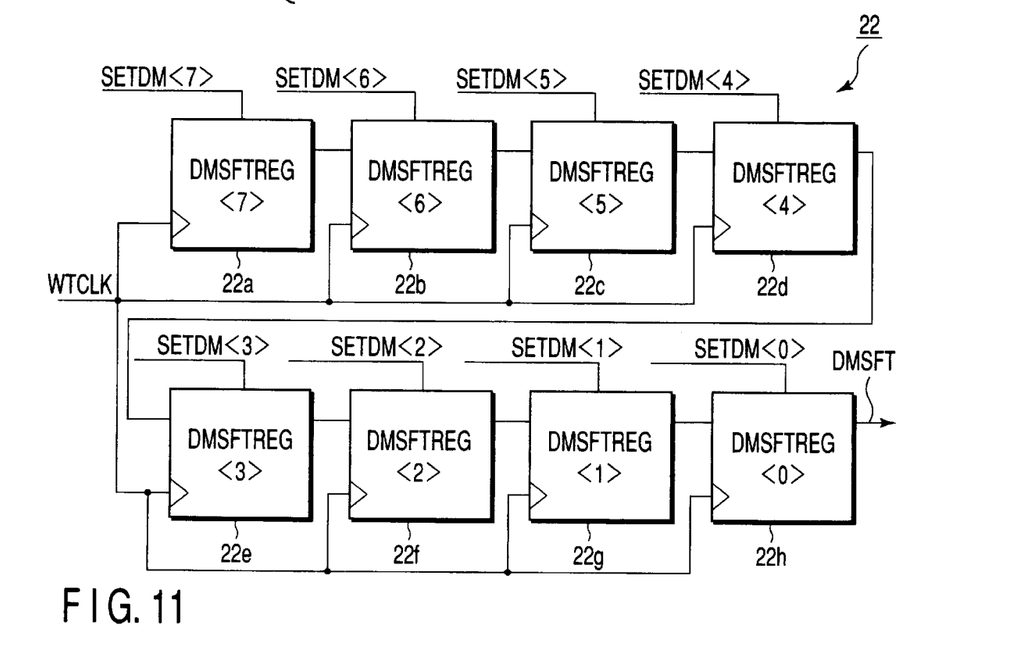
FIG. 11 is a schematic circuit diagram of the data mask shift circuit of the embodiment of FIG. 10.

FIGS. 10 and 11 schematically illustrate the second embodiment of the invention. This second embodiment is adapted to allow the user select the DM method, the programmable data masking method (to be referred to as the PDM method hereinafter) and the VWPDM method. The PDM method is a data masking method different from the DM method and the VW method. The VWSPDM method is a data masking method realized by applying the PDM method to the VW method.

As described earlier, with the DM method, the masked position is shifted according to the signal DMIN supplied to the DM pin. On the other hand, with the PDM method, the position for masking data can be shifted for each burst according to the signal obtained by decoding the address that is taken in simultaneously with a write command.

With the VW method, the masked position is shifted by changing the burst length. On the other hand, with the VWPDM method, the burst length is changed by means of the VW method and the position for masking data can be shifted appropriately for the changed burst length according to the address.

FIG. 10 is a schematic block diagram of the second embodiment of semiconductor memory device according to the present invention. In FIG. 10, the components same as or similar to those of the first embodiment of FIG. 1 are denoted respectively by the same reference symbols and will not be described any further.

Referring to FIG. 10, mask decoder (VWDMDEC) 21 decodes the mask position for both the VW method and the DM method. The higher order addresses AILTC2t through AILTC4t that are taken in with the write command at the time of the write operation are supplied to the mask decoder (VWDMDEC) 21. The mask decoder 21 decodes the 3-bit higher order addresses AILTC2t through AILTC4t and generates, for instance, eight pattern signals SETDM0 through SETDM7 for indicating the mask position. The signals SETDM0 through SETDM7 are supplied to data mask shift circuit (DMSHIFT) 22 along with the basic internal clock signal WTCLK.

FIG. 11 is a schematic circuit diagram of the data mask shift circuit 22 of this embodiment. The data mask shift circuit 22 comprises eight shift registers (DMSFTREG) 22a through 22h that are connected in series. The shift registers 22a through 22h are supplied respectively with the signals SETDM7 through SETDM0 sent from said mask decoder 21. The signals SETDM7 through SETDM0 supplied to the shift registers 22a through 22h are shifted sequentially in synchronism with the basic internal clock signal WTCLK and output from the output terminal of the shift register 22h as signal DMSFT. The timing of outputting the signal DMSFT is shifted according to the decoded signals SETDM7 through SETDM0. In other words, the timing of outputting the signal DMSFT is shifted according to said higher order addresses.

The signal DMSFT is supplied to one of the input terminals of the AND circuit 23 shown in FIG. 10. The other input terminal of the AND circuit 23 is supplied with the output signal bDMEN of said DM signal generation circuit 12. The AND circuit 24 is supplied with the signal DMEN and the control signal DMIN output from said latch circuit 18.

When the DM method is selected, the option pad 11 is made to remain in the non-connected (open) state. Therefore, the signals bDMEN and DMEN output from the DM signal generation circuit 12 are held to level LOW and level HIGH respectively so that the AND circuit 24 is selected.

When the PDM method and the VWPDM method are selected, the option pad 11 is connected to the inner lead and grounded. Therefore, the signals bDMEN and DMEN output from the DM signal generation circuit 12 are held to level HIGH and level LOW respectively so that the AND circuit 23 is selected.

The output terminals of the AND circuits 23, 24 are connected to the input terminal of the NOR circuit 25. The output signal of the NOR circuit 25 is supplied to the write control circuit 16 by way of the inverter 26 as control signal DM. In other words, the control signal DM is supplied to the write control circuit 16 in place of the control signal DMIN shown in FIG. 1.

Figure 12:
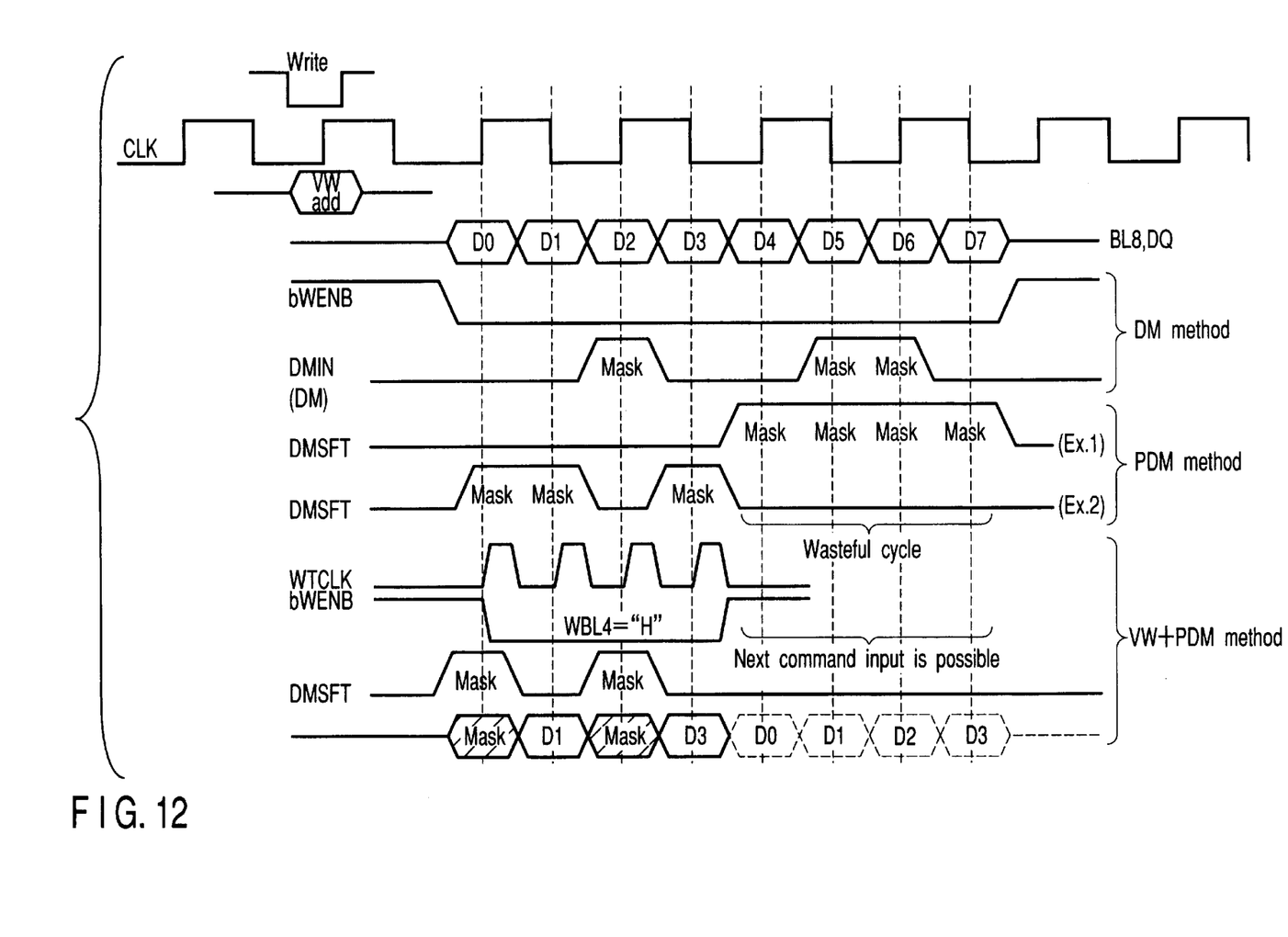
FIG. 12 is a timing chart of the operation of the embodiment of FIG. 10.

FIG. 12 shows how the embodiment operates with the DM method, the PDM method and the VWPDM method.

For example, when the DM method is selected, the counter 15 outputs write enable signal bWENB for a period corresponding to the burst length defined by means of the mode register. If control signal DMIN is supplied to the buffer circuit 17 from the external connection pin during the period where the write enable signal bWENB, the control signal DMIN output from the buffer circuit 17 is supplied to the AND circuit 24 by way of the latch circuit 18. Then, the output signal of the NOR circuit 25 changes as according to the output signal of the AND circuit 24 and control signal DM is output from the inverter circuit 26. The control signal DM and the write enable signal bWENB are supplied to the data write control circuit 16. The write control circuit 16 outputs write pulse signals WTPLS0 through WTPLS3 in synchro-nism with the basic internal clock signal WTCLK. Each of the write pulse signals WTPLS0 through WTPLS3 has part made non-active corresponding to the control signal DM. Then, the write pulse signals WTPLS0 through WTPLS3 are supplied to the block of the memory cell array 19 selected by the selection signals SELECT0 through SELECT3. In FIG. 12 illustrating the DM method, data D2, D5, D6 are masked when the burst length is equal to BL=8.

When the PDM method is selected, on the other hand, the counter 15 outputs write enable signal bWENB for a period corresponding to the burst length defined by means of the mode register. Meanwhile, the data mask shift circuit 22 outputs signal DMSFT indicating the mask position according to the higher order addresses AILTC2t through AILTC4t decoded by the mask decoder 21. The signal DMSFT is supplied to the AND circuit 23. The output signal of the NOR circuit 25 changes according to the output signal of the AND circuit 23 and control signal DM is output from the inverter circuit 26. The control signal DM and the write enable signal bWENB are sent to the write control circuit 16. Then, the write control circuit 16 outputs the write pulse signals WTPLS0 through WTPLS3 in synchronism with the basic internal clock signal WTCLK. Each of the write pulse signals WTPLS0 through WTPLS3 has part made non-active corresponding to the control signal DM. Then, the write pulse signals WTPLS0 through WTPLS3 are supplied to the block of the memory cell array 19 selected by the selection signals SELECT0 through SELECT3. In FIG. 12 illustrating (Example 1 of) the PDM method, data D4 through D7 are masked when the burst length is equal to BL=8. On the other hand, in FIG. 12 illustrating (Example 2 of) the PDM method, data D0, D1, D3 are masked according to the signal DMSFT.

Finally, when the VWPDM method is selected, the counter 15 operates exactly same as its counterpart of the first embodiment. The counter 15 outputs write enable signal bWENB for a period corresponding to the burst length defined according to the higher order addresses that are decoded by the decoder 13. Meanwhile, the data mask shift circuit 22 outputs signal DMSFT indicating the mask position according to the higher order addresses AILTC2t through AILTC4t decoded by the mask decoder 21. The signal DMSFT is supplied to the AND circuit 23. The output signal of the NOR circuit 25 changes according to the output signal of the AND circuit 23 and control signal DM is output from the inverter circuit 26. The control signal DM and the write enable signal bWENB are sent to the write control circuit 16. Then, the write control circuit 16 outputs the write pulse signals WTPLS0 through WTPLS3 in synchronism with the basic internal clock signal WTCLK. Each of the write pulse signals WTPLS0 through WTPLS3 has part made non-active corresponding to the control signal DM. Then, the write pulse signals WTPLS0 through WTPLS3 are supplied to the block of the memory cell array 19 selected by the selection signals SELECT0 through SELECT3. In FIG. 12 illustrating the VWPDM method, data D0, D2 are masked according to the signal DMSFT when the burst length is equal to BL=4. Thus, with the above described second embodiment, the mask decoder 21 decodes the higher order addresses AILTC2t through AILTC4t and the data mask shift circuit 22 generates signal DMSFT that indicates a mask position from the decoded output signal of the mask decoder 21. Thus, the position for masking data can be shifted by means of the signal DMSFT. Therefore, any data can be masked by using a fixed burst length with the PDM method, whereas any data can be masked by using a variable burst length with the VWPDM method. Thus, data can be masked in various different ways with the second embodiment.

Further, with the second embodiment, one of the DM method, the PDM method and the VWPDM method can be selected to satisfy the user to the great advantage on the part of the latter.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a first generation circuit for generating a first burst length according to an address signal;
   a specifying circuit for specifying one of a first masking method and a second masking method;
   a selection circuit configured to receive with the first burst length generated by said first generation circuit, a second burst length held in a register and the output signal of said specifying circuit, said selection circuit configured to select the first burst length when the output signal of said setting circuit specifying said first masking method, and to select the second burst length when the output signal of said specifying circuit specifying said second masking method;
   a second generation circuit connected to said selection circuit, said second generation circuit configured to generate a write enable signal according to said first or second burst length selected by said selection circuit;
   a third generation circuit for generating a mask signal indicating the position of the data to be masked;
   a fourth generation circuit connected to said second generation circuit and said third generation circuit, said fourth generation circuit configured to generate a write pulse signal according to the mask signal supplied from said third generation circuit in response to the specification of said second masking method made by said specifying circuit and according to the write enable signal supplied from said second generation circuit in response to the specification of said first masking method made by said specifying circuit.

2. The device according to claim 1, wherein said first generation circuit is a decoder for decoding said address signal according to a signal indicating the burst length.

3. The device according to claim 1, wherein said first masking method is the Variable Write burst length (VW) method and said second masking method is the Data Mask (DM) method.

4. The device according to claim 1, wherein
   said specifying circuit comprises:
      a pad; and
      a signal generation circuit connected to said pad, said signal generation circuit configured to generate a signal indicating said first masking method when said pad is connected to a first potential and a signal indicating said second masking method when said pad is open.

5. The device according to claim 4, wherein
   said signal generation circuit comprises:
      a transistor having one end of the current path thereof connected to a second potential and another end connected to said pad; and
      at least one inverter circuit having its input terminal connected to said pad.

6. The device according to claim 1, wherein
   said second generation circuit comprises:
      a counter for counting the first or second burst length; and
      a logic circuit configured to output said write enable signal at a timing corresponding to the count value of said counter.

7. The device according to claim 1, further comprising:
   a memory cell array connected to the output terminal of said selection circuit, said memory cell array having a plurality of blocks.

8. The device according to claim 7, further comprising:
   a plurality of block selection signals for selecting one of said plurality of blocks, said plurality of block selection signals being supplied to said fourth generation circuit, said fourth generation circuit configured to supply said write pulse signal to said block selected by said block selection signals.

9. A semiconductor memory device comprising:
   a first generation circuit for generating a first burst length according to an address signal;
   a specifying circuit for specifying one of a first masking method and a second masking method;
   a first selection circuit configured to receive with the first burst length generated by said first generation circuit, a second burst length held in a register and the output signal of said specifying circuit, said first selection circuit configured to select the first burst length when the output signal of said specifying circuit specifying said first masking method, and to select the second burst length when the output signal of said specifying circuit specifying said second masking method;
   a second generation circuit connected to said first selection circuit, said second generation circuit configured to generate a write enable signal according to said first or second burst length selected by said first selection circuit;
   a third generation circuit for generating a first mask signal indicating the position of the data to be masked;
   a fourth generation circuit for generating a second mask signal indicating the position of the data to be masked according to the second address signal;
   a second selection circuit configured to receive with the output signals of said third and fourth generation circuits, said second selection circuit configured to select said second mask signal supplied from said fourth generation circuit in response to the specification of said first masking method made by said specifying circuit and said first mask signal supplied from said third generation circuit in response to the specification of said second masking method made by said specifying circuit;
   a fifth generation circuit connected to said second generation circuit and said second selection circuit, said fifth generation circuit configured to generate a write pulse signal according to said first mask signal supplied from said second selection circuit in response to the specification of said second masking method made by said specifying circuit and according to both said second mask signal supplied from said second selection circuit and said write enable signal fed from said second generation circuit in response to the specification of said first masking method made by said specifying circuit.

10. The device according to claim 9, wherein said first generation circuit is a decoder for decoding said address signal according to a signal indicating one of the burst lengths.

11. The device according to claim 9, wherein said first masking method is the Programmable Data Masking (PDM) method and the Variable Write burst length Programmable Data Masking (VWPDM) method and said second masking method is the Data Masking (DM) method.

12. The device according to claim 9, wherein
said specifying circuit comprises:
    a pad; and
    a signal generation circuit connected to said pad, said signal generation circuit configured to generate a signal indicating said first masking method when said pad is connected to a first potential and a signal indicating said second masking method when said pad is open.

13. The device according to claim 12, wherein
said signal generation circuit comprises:
    a transistor having one end of the current path thereof connected to a second potential and the other end connected to said pad; and
    at least one inverter circuit having its input terminal connected to said pad.

14. The device according to claim 9, wherein
said second generation circuit comprises:
    a counter for counting the first or second burst length; and
    a logic circuit configured to output said write enable signal at a timing corresponding to the count value of said counter.

15. The device according to claim 9, further comprising:
a memory cell array connected to the output terminal of said selection circuit, said memory cell array having a plurality of blocks.

16. The device according to claim 9, further comprising:
a plurality of block selection signals for selecting one of said plurality of blocks, said plurality of block selection signals being supplied to said fifth generation circuit, said fifth generation circuit configured to supply said write pulse signal to said block selected by said block selection signals.

17. The device according to claim 9, wherein
said fourth generation circuit comprises:
    a decoder for decoding said second address signal, said decoder configured to generate said second mask signal indicating the mask position corresponding to said address signal; and
    is a shift register connected to said decoder, said shift register configured to shift said second mask signal fed from said decoder according to a clock signal.

18. A semiconductor memory device comprising:
a specifying circuit for selecting one of a first masking method and a second masking method;
a first generation circuit for generating a signal corresponding to said first masking method;
a second generation circuit for generating a signal corresponding to said second masking method; and
a third generation circuit connected to the output terminal of said second generation circuit;
wherein said third generation circuit configured to generate a write pulse signal on the basis of the output signal of said first generation circuit in response to the specification made by said specifying circuit of said first masking method and on the basis of the output signal of said second generation circuit in response to the specification made by said specifying circuit of said second masking method.

19. The device according to claim 18, wherein said first masking method is the Variable Write burst length (VW) method and said second masking method is the Data Mask (DM) method.

20. The device according to claim 18, wherein
said specifying circuit comprises:
    a pad; and
    a signal generation circuit connected to said pad, said signal generation circuit configured to generate a signal indicating said first masking method when said pad is connected to a first potential and a signal indicating said second masking method when said pad is open.

* * * * *